(12) United States Patent
Sandström

(10) Patent No.: US 6,950,194 B2
(45) Date of Patent: Sep. 27, 2005

(54) ALIGNMENT SENSOR

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 353 days.

(21) Appl. No.: 10/310,637

(22) Filed: Dec. 4, 2002

(65) Prior Publication Data

US 2003/0128367 A1 Jul. 10, 2003

Related U.S. Application Data

(60) Provisional application No. 60/337,764, filed on Dec. 7, 2001.

(51) Int. Cl.[7] ............................. G01B 9/02; G01B 11/00
(52) U.S. Cl. ...................................... 356/508; 356/401
(58) Field of Search ................................. 356/508, 509, 356/400, 401

(56) References Cited

U.S. PATENT DOCUMENTS

| | | |
|---|---|---|
| 4,902,133 A | 2/1990 | Tojo et al. |
| 5,148,157 A | 9/1992 | Florence |
| 5,202,748 A * | 4/1993 | MacDonald et al. ........ 356/508 |
| 5,227,838 A | 7/1993 | Nakanishi et al. |
| 5,467,146 A | 11/1995 | Huang et al. |
| 5,471,305 A | 11/1995 | Yoneda et al. |
| 5,563,706 A | 10/1996 | Shibuya et al. |
| 5,598,265 A | 1/1997 | de Groot |
| 5,835,256 A | 11/1998 | Huibers |
| 6,111,646 A | 8/2000 | Naulleau et al. |
| 6,118,335 A | 9/2000 | Goldberg et al. |
| 6,118,535 A | 9/2000 | Goldberg et al. |
| 6,142,641 A | 11/2000 | Cohen et al. |
| 6,184,994 B1 | 2/2001 | Freischlad |
| 6,252,667 B1 | 6/2001 | Hill et al. |
| 6,285,488 B1 | 9/2001 | Sandstrom |
| 6,384,898 B1 | 5/2002 | Inoue et al. |
| 6,504,644 B1 | 1/2003 | Sandstrom |
| 6,717,097 B1 | 4/2004 | Sandstrom et al. |
| 6,721,052 B2 * | 4/2004 | Zhao et al. ................. 356/636 |

FOREIGN PATENT DOCUMENTS

| | | |
|---|---|---|
| EP | 1 148 390 A2 | 10/2001 |
| WO | WO 02/073122 A2 | 9/2002 |

OTHER PUBLICATIONS

Daniel Malacara "Optical Shop Testing", 1992, pp. 501–510 and 700–707, Second Edition, John Wiley & Sons, Inc.

* cited by examiner

*Primary Examiner*—Gregory J. Toatley, Jr.
*Assistant Examiner*—Patrick Connolly
(74) *Attorney, Agent, or Firm*—Ernest J. Beffel, Jr.; Haynes Heffel & Wolfeld LLP

(57) ABSTRACT

The present invention relates in general to detection of an alignment mark on a workpiece. More particularly, interferometry is applied to detect alignment signals from the surface of a workpiece such as a wafer or reticle. Other aspects of the present invention are reflected in the detailed description, figures and claims.

19 Claims, 2 Drawing Sheets

ALIGNMENT SENSOR

RELATED APPLICATIONS

This application claims priority to U.S. Provisional Application Ser. No. 60/337,764 filed on 7 Dec. 2001 entitled Light Beam Homogenizer.

TECHNICAL FIELD

The present invention relates in general to detection of an alignment mark on a workpiece. More particularly, interferometry is applied to detect alignment signals from the surface of a workpiece such as a wafer or reticle.

BACKGROUND OF THE INVENTION

Alignment of work pieces is critical to precision semiconductor device manufacturing. The workpiece may be a so-called wafer. Silicon dioxide is a common wafer material, but other substrates such as gallium arsenide are also used. The workpiece needs to be precisely aligned during manufacturing. For instance, in direct writing to a substrate, the position of the substrate must be determined precisely so that patterning of one layer on top of the next will create the desired three-dimensional structures. For writing in a stepper, a mask must be precisely aligned with the workpiece. For patterning a complex mask, such as a phase shift mask, the position of the workpiece must be precisely determined so that the phase shift areas will be positioned properly in relationship to un-shifted areas of the mask.

Alignment marks typically are formed on a workpiece to assist with alignment. The spaces between chips or around the perimeter of a wafer are available for placement of alignment marks. Some equipment manufacturers, such as Nikon, favor elevated structures for alignment. Others, such as ASML, favor trenches. Alignment marks may be structures on or in the workpiece by depositing some material. Formed structures may be of a material similar to the underlying or may be strongly contrasting, such as copper on an oxide of silicon or a glass material. Contrasting colors may result from contrasting materials or from thin films.

Some manufacturing processes, such as chemical-mechanical planarization (CMP), can erode an alignment mark. Ideally, CMP flattens the surface of a wafer without any bias. However, as with a saw that cuts deeper on the push stroke than the pull stroke, CMP sometimes will remove one edge of a mark more than another edge. Even without bias, a mark that lands in a relative high area of a wafer may be abraded across the entire mark.

Other manufacturing processes, such as forming an oxide or glass layer, or applying resist may cover or obscure an alignment mark. Manufacturing of chips increasingly involves creation of multi-layer structures. Structures are becoming increasingly vertical, as efforts are made to shrink feature sizes and condense features into smaller areas. Layering of structures on a wafer tends to obscure alignment marks or, in signal processing terms, reduce the signal that an alignment system is trying to detect. In some instances, very faint marks may be desirable.

Accordingly, an opportunity arises to introduce new methods of and devices for precise alignment of work pieces, including wafers and reticles.

SUMMARY OF THE INVENTION

The present invention relates in general to detection of an alignment mark on a workpiece. More particularly, interferometry is applied to detect alignment signals from the surface of a workpiece such as a wafer or reticle. Other aspects of the present invention are reflected in the detailed description, figures and claims.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

The basic problem in alignment is to create contrast out of a mark that may be eroded, degraded or covered with several process layers. Known alignment systems use a bright-field or dark-field image, a scanning laser beam forming an image or scattering from gratings and measuring the phase of the diffracted order. The present invention is different: it forms an image, or equivalent information such as stored data for the edges in the alignment mark, but it is not the same type of image that is being used by known alignment sensors. While known image-forming alignment systems form camera images, the present invention forms an abstract image that exists in computer memory. At each point it stores more than one quantity. It may consist of multi-spectral reflectance data or reflectance data for different polarizations. Most preferably is consists of at least one complex amplitude value, i.e. a complex value, per image point. It may contain similar complex data with several filter settings or for different focus settings or other alternative configurations.

Figure 1:
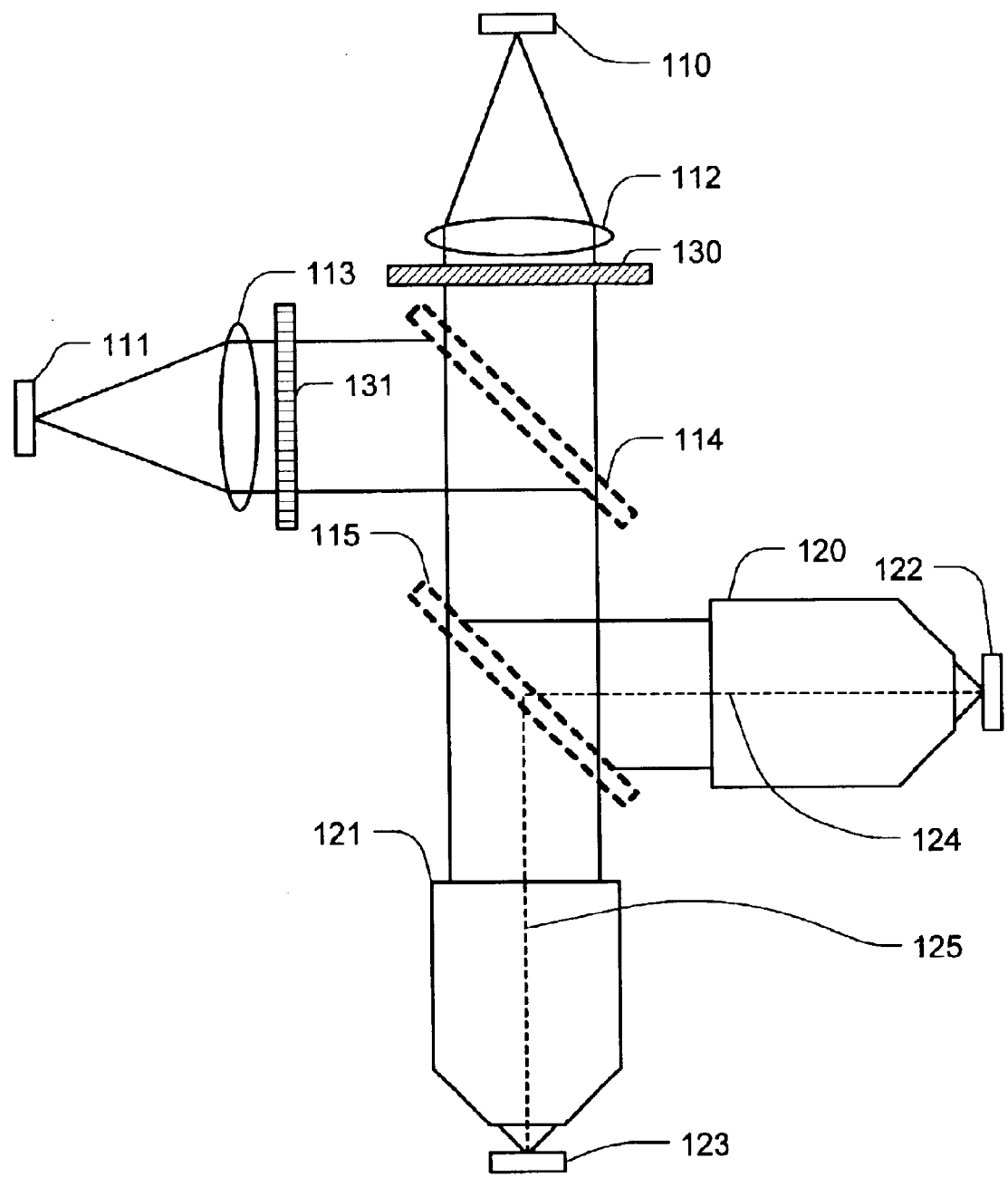
FIG. 1 depicts use of an interferometer to detect an alignment mark.

FIG. 1 illustrates one embodiment of using an interferometer to detect an alignment mark on a work piece. The interferometer illustrated may be considered a Linnik interferometer, based on the configuration of lenses, reference, source and camera depicted. An illuminator can be placed at either 110 or 111 in the figure and a detector placed at the opposite location. The illuminator generates a radiation in a part of the spectrum that generates useful interference patterns, preferably without damaging the surface of the work piece on which the radiation impinges. A CCD or CMOS camera or other sensor array can be used as a detector, at least for photon radiations. Similarly, the work piece can be placed at 123 or 122 and a reference can be placed at the opposite location. A wafer or reticle can be the work piece. A mirror or other element that returns radiation can be the reference. Supposing that the illuminator is at 110 and the work piece at 123, the illumination and returned radiation traverse the splitters 114, 115, the first lens systems 112, 113 and the second lens systems 120, 121 as follows. The illumination is focused by one or more lenses in the first lens system 112. Preferably, the first lens system produces essentially parallel central axes of cones of radiation. The illumination passes through the first splitter 114, without any useful splitting of the illumination. The illumination passes through the second splitter 115 and is divided along two paths 124, 125. The first path 125 passes through a second lens system 121 and impinges on the work piece 123. The second lens system may comprise one or more lenses. The second path 124 passes through another second lens system and impinges on the reference 122. Phase-related information is generated by varying the relative length of the paths 124, 125. The relative lengths of paths 124, 125 can be varied by moving either the work piece 123 or the reference 122 relative to the splitter 115 or the phase could be changed by an electrooptical device such as an electrooptical, acoustooptic or photoelastic devices. In order to achieve high depth resolution the phase of the measurement beam is compared to a reference, which can be a different reference beam or the same beam phase-shifted, frequency-shifted or at a different time or location on the surface. The interferometric principle gives a depth resolution only limited by optical and electronic noise, typically below one nanometer. In the case of mechanically changing the path length only the work piece or the reference need be moved. Alternatively, some or all of the elements of one of the second lens systems can be moved along with the work piece or the reference. A piezoelectric crystal can be used to precisely change the position of one of these items. A further alternative is to move the splitter 115. Radiation returned from the work piece and the reference impinges on the first splitter 114, passes through another first lens system 113 and is projected onto a detector 111. An interference pattern is projected, which corresponds to the phase relationship of light that has traversed the first and second paths 124 and 125. Interferometric schemes and ways to extract the complex amplitude reflection coefficient of the surface from the interferometer are well known in the art, e.g. as described in "Optical Shop Testing 2d Ed." by Daniel Malacara, pages 501–510 and 700–707 John Whiley & Sons, Inc. (New York 1992), "Handbook of Optics" McGraw-Hill (New York) and in scientific and engineering journals.

The complex amplitude is determined by the complex amplitude reflection coefficient of the surface, different from point to point, and the height of the surface. For a flat surface the height information is extremely precise, typically better than 1 nm, possibly better than 0.1 nm. In a mark having only a height difference in a homogeneous metal film the main information is the height. In a mark formed for example in a damascene process where the mark has a different chemical composition than the background the complex amplitude shows the difference in complex refractive index, which is typically different even from one white metal to another, and even more so if a suitable wavelength is chosen. Details on refractive index of metals can be found in Handbook of Optics. In a third case the mark and/or the background has at least partially transparent surface films. Again the complex amplitude tells the story. The combination of height and chemical composition and sensitivity to surface films, down to sub nanometer thickness, makes the invented alignment sensor robust and sensitive. A problem with alignment marks after CMP is that they may be non-symmetrically eroded by the CMP process. The sensor giving a high-resolution height map provide information on this asymmetry and gives clues to the amount of correction needed to the position data. With visible light from 700 to 500 nm and a lens with NA=0.8 the lateral resolution is of the order of 0.5 microns. A image with even higher resolution can be created by model-fitting to a priori data about the mark. For example, if it is known that the mark consists of only two opaque materials and that there is a sharp boundary between them it is possible to locate this boundary much more accurately than the optical resolution might indicate."

Optionally, color, spatial, polarizing or other filters can be applied, for instance at location 130 or 131. Preferably, both paths of radiation are affected by the filter, to enhance the resulting interference pattern. It may be useful in some instances to apply a filter to just one of the paths, for instance between the splitter 115 and one of the second lens systems 120, 121 or between elements of the second lens systems. A color wheel or other color filters can be applied to enhance the contrast between a material used to form an alignment mark and an adjacent material. In one embodiment, the color filters may be matched to responsiveness of a multi-element detector, such as an RGB camera. In another, color filters can be selected to span elements of a multi-element detector. Alternatively, the illuminator may be one or more lasers configured to produce more than one wave band of illumination, thereby enhancing the contrast without requiring filters. Using a broad band illuminator is a way of reducing speckle compared to a laser image and gives additional depth information as well as spectral information about the mark.

One way to produce an alignment mark is to expose, but not develop resist. The optical properties of resist change subtly when it is exposed, even before it is developed. This subtle change produces a weak signal that must be detected with a different radiation source than used to create the mark. The methods and devices of the present invention can be adapted to read marks formed by exposure of resist, with choice of a filter or illumination source that can read without further exposing resist.

A spatial filter can be applied to enhance surface contour and other patterns. A variety of spatial filters that might be applied are described in Reynolds, et al., The New Physical Optics Notebook: Tutorials in Fourier Optics, chs. 29–39 SPIE Optical Engg Press: Bellingham, Wash. 1989. Contrast-enhancing filters are known in microscopy, e.g. phase-contrast filters, confocal spatial filtering, apodisation filters, Nomarsky filters, polarization filters, etc. cf. Handbook of Optics. Filters can be combined with the interferometer to enhance the image, or equivalent contrast enhancements can be added digitally to the acquired image. The latter scheme is beneficial since it allows simple, even automatic, selection of suitable filters to enhance a particular image, while optical filtering can improve the signal-to-noise of the image. For instance, if the alignment mark is known, spatial filters can be designed to enhance a rise or fall in an edge or to detect a particular pattern. After CMP, the mark is often distorted. It is believed that a high-resolution interferometric image will provide surface profile information sufficient to detect the distortion of the mark and give clues to corrections. Asymmetric optical filters in the beam are a way of improving the lateral information and thus allows better correction for mark distortion. A variety of spatial filters on a filter wheel, for instance, can be used to detect various potential asymmetries of a CMP or similar process. It also may be useful for coarse searching for a pattern. Polarizing filters also may be used for enhancing directions information.

While a Linnik interferometer is illustrated, many other configurations of interferometers can be used. Other kinds of interferometers that can be adapted for this use include well-known interferometer configurations named after Fizeau, Michelsson, Twyman-Green, Smartt, Mach-Zehnder, Sommargren and Mireau or modifications to them. Several interferometers for surface profiling are described in "Optical Shop Testing", pages 700–707. Some of these interferometers have a surface depth resolution of better than 0.1 nm. The positioning of filters is adapted to the optics of the particular interferometer.

In practice, this alignment detection system can be applied with phase stepping or filter variation, with a particular filter selected or with a relatively narrow band illumination source. Relatively narrow includes, but is not limited to, laser sources, without and without line narrowing. With phase stepping, the work piece is positioned near the expected location of an alignment mark. Phase stepping is discussed in "Optical Shop Testing". Phase stepping interferometers give a point-wise map of the complex amplitude reflection coefficient of the surface which contains information about height, material composition and the presence of surface layers. It is believed that a phase-stepping interferometer with multi-spectral or broadband illumination extracts all available information from a surface area for subsequent analysis in the digital domain. Alignment marks may include any conventional mark. Marks with some degree of symmetry are preferred, to assist in locating the center of the mark. Marks with a complex structure, i.e. many edges per surface area, are preferred. A mark with two or more grating structures forming angles to each other can be used. Marks with a mixture between small and larger structures can be used to improve the accuracy of alignment after CMP, since small and large features are deformed differently. With an appropriate search algorithm, asymmetrical marks also can be used. The expected location of the alignment mark should be close to the actual mark, given the precision of these manufacturing processes. A scan pattern is initiated. The scanning may involve stepping and imaging or continuous movement of a stage supporting a workpiece. When the stage moves continuously, collection of returned radiation may be at closely spaced intervals, so that many radiation patterns overlap. An array of detectors can configured with sufficient pixels to be used with a continuously moving stage. The movement of the stage can be taken into account when compiling data corresponding to the complex amplitude of radiation returned from the surface of the work piece, by accounting for the migration of the stage across the detector array. A piezoelectric crystal responds quickly and can adjust the path length to a work piece or a reference quickly. Electrooptical, acoustooptic or photoelastic devices also can adjust phase relationships quickly. Accordingly, it is preferred to take collect multiple radiation patterns at phase relationships, instead of replicating the position of the stage in a second pass at a second path length. Any conventional scan pattern can be used to detect the alignment mark.

Multiple scans may be applied, varying filters applied to the radiation. If filters need to be moved into position, this may take longer than actuating a solid state component, such as a piezoelectric crystal. While stage movement may be slow enough or delayed enough for filters to change (for instance with a rapidly spinning filter wheel or with a polarizing filter that can be actuated and de-actuated in place), a less elaborate filter changer mechanism may be applied by performing a scan, changing a filter (including changing from clear to colored or from wide open spatial to restricted spatial), and scanning again. A sequence of filter types can be selected for coarse and successively finer image resolution. Successive scan patterns need not match prior scans, as information from prior scans can be used to reduce the search domain, if an alignment pattern is located, or to signal an error condition, if no indication of an alignment mark appears in an expected area. In a preferred embodiment, the interferometer acquires an image of the surface on a CCD camera or similar device, but a point-wise data acquisition together with mechanical scanning motion can also be used to build up an image or other 2-dimensional representation of the mark.

Detection of an alignment mark on a wafer work piece can be combined with successive steps in manufacture of a chip. For instance, after an alignment mark is detected, the chip manufacturing method can include exposing a resist layer, based on the location of the alignment mark. The resist layer can be exposed by direct writing or in a stepper. Direct writing can be performed using a scanning laser, scanning electron beam, vector driven electron beam, an SLM device, or a near-field exposure system such as arrays of nanotubes exposing the resist by direct electric excitation. The resist layer can, in many ways, be used to form multiple structures on various areas of the chip. Those familiar with chip manufacturing will understand that patterning of resist layers is fundamental to formation of structures on or over a semiconductor substrate. Applying the alignment and patterning method of this invention may form a semiconductor structure in, on or over a semiconductor substrate. Subsequent processing, including developing the resist, selectively removing the resist, etching through the removed resist areas, deposition or growth of additional material, applying additional resist, and repeated application of the alignment and patterning method, will be necessary to complete and finish the component, but will not materially change the substrate in which the semiconductor structure was formed. The structure formed by precise alignment using an interferometer may be essential to the functioning of a semiconductor component and to a whole product incorporating the semiconductor component. This may be especially true of custom semiconductor components, produced in short runs, for which direct writing and precise alignment may be enabling technologies.

Detection of an alignment mark on a reticle work piece can also be combined with successive steps in the manufacture of a chip. For instance, a phase shift reticle can be produced, using the alignment methods describe above, according to a manufacturer's specification for the mask and the reticle can be used to expose a resist layer, using the mask prepared using the alignment method. The resist layer can, in many ways, be used to form multiple structures on various areas of the chip, as described above, creating structures critical to the semiconductor component and creating a component that is critical to a product.

Figure 2:
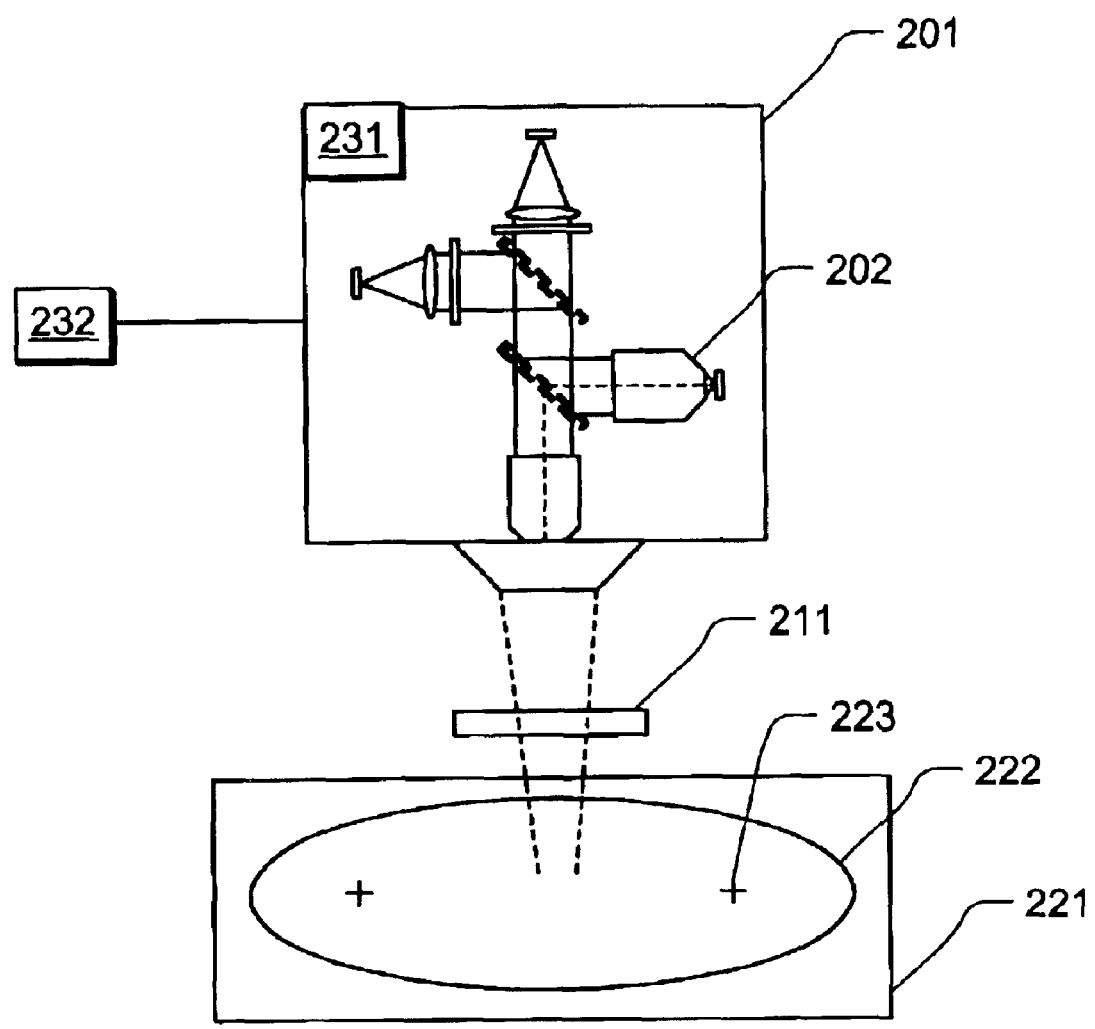
FIG. 2 depicts combination of an interferometer alignment device with a pattern generator or inspection device.

An interferometer alignment system can be combined with many types of pattern generator and with many types of inspection devices. Types of pattern generator include a laser scanner, an electron scanner, a vector driven electron beam, an SLM device, a near-field exposure system, a stepper or any present or future variation on these categories of device. Inspection devices include devices that compare a pattern desired with a pattern produced on a reticle or wafer, for instance. They also include devices that measure the phase depth of a phase shifting structure on a reticle. FIG. 2 generically depicts these combinations. The work piece 222 includes one or more alignment marks 223. Some work pieces sit on a stage 221. A device such as a direct writer, mask writer, stepper or inspector 201 is paired with an interferometer alignment device 202. In some embodiments, the device 201 is a stepper and a reticle 211 is used to expose the resist on the work piece. In other embodiments, the device 201 is a direct writer. A direct writer may control the exposing radiation by shaping a radiation pattern, for instance with an SLM, or by directing a modulated radiation, as in a beam vector or scanning device. A direct writer also may control the exposing radiation using a shutter-like reticle 211 that controls the passage of radiation through areas of the reticle. Unwanted radiation may be blocked or diffracted away from the wafer. Diffracted radiation may be intercepted by an aperture, for instance. In other embodiments, the device 201 is a mask writer. A mask writer is similar to a direct writer, except that the work piece is a reticle instead of a wafer or chip. The operating parameters of a mask writer differ from a direct writer, because of the work piece. They are similar, because they need precise alignment. In yet other embodiments, the device 201 is a stepper that uses a reticle 211. A stepper may require alignment of both the reticle 211 and the wafer 222. The alignment device and method can be used to align both the wafer 222 on the stage and the reticle or mask 211 used for printing. Either a wafer or reticle can be considered a work piece in need of alignment. Inspection devices 201 also may benefit from precise alignment. In inspection devices that compare the pattern desired to the pattern produced, as opposed to inspection devices that measure surface roughness or surface particle contamination, alignment is a touchstone for pattern matching or correlation.

Another embodiment of the present invention is a control program that drives an interferometer instrument through collection of data corresponding to a complex amplitude of radiation returned from the surface of a work piece or through collection of data corresponding to radiation subject to a plurality of filters and returned from the surface of the work piece. In FIG. 2, control programs are alternatively depicted as 231 being operative on the device 201 or as 232 being external to the device 201. Various programs can be used to drive interferometer instruments and stepped or continuous stage movement through scanning patterns and through path length variation, filter variation, or both. Control programs may be embodied in a magnetic medium that is distributed or that is resident in or in communication with a device 201. The programs may direct the interferometer instrument to perform any of the methods identified above.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

I claim:

1. A method of detecting an alignment mark on a workpiece, comprising the actions of:
   impinging a radiation on a surface of the workpiece, through an interferometer, while scanning the alignment mark;
   employing phase modulation to generate complex amplitude information using radiation returned from the surface of the workpiece; and
   collecting data corresponding to the complex amplitude information for the scanned alignment mark.

2. The method according to claim 1, further including creating an image of the complex amplitude information across the scanned alignment mark.

3. The method according to claim 1, wherein the radiation is a broad spectrum light source.

4. The method according to claim 3, wherein at least one colored filter is applied to the radiation.

5. The method according to claim 3, wherein at least one spatial filter is applied to the radiation.

6. The method according to claim 3, wherein at least one polarizing filter is applied to the radiation.

7. The method according to claim 1, further including varying the radiation at least once during the impinging of the radiation.

8. The method according to claim 7, wherein at least one colored filter is applied to the radiation.

9. The method according to claim 7, wherein at least one spatial filter is applied to the radiation.

10. The method according to claim 7, wherein at least one polarizing filter is applied to the radiation.

11. The method of claim 1, further including aligning the workpiece utilizing the data.

12. The method of claim 11, further including forming patterns in resist on the workpiece after aligning the workpiece.

13. The method of claim 11, further including forming patterns in resist on the workpiece after aligning the workpiece, selectively removing the resist, and forming structures in the workpiece through the selectively removed resist.

14. A method of detecting an alignment mark on a workpiece, comprising the actions of:
    impinging a radiation on the surface of the workpiece, through an interferometer, while scanning the alignment mark;
    collecting at least complex amplitude data corresponding to radiation returned from the surface of the workpiece;
    aligning said workpiece utilizing said data; and
    exposing a resist layer on said workpiece utilizing said alignment.

15. The method according to claim 14, wherein at least one colored filter is applied to the radiation.

16. The method according to claim 14, wherein a plurality of wavelengths are used for the radiation.

17. The method according to claim 14, wherein at least one spatial filter is applied to the radiation.

18. The method according to claim 14, wherein at least one polarizing filter is applied to the radiation.

19. The method of claim 14, further including forming patterns in resist on the workpiece after aligning the workpiece, selectively removing the resist, and forming structures in the workpiece through the selectively removed resist.

* * * * *